United States Patent
Takahama et al.

(10) Patent No.: US 10,008,988 B2
(45) Date of Patent: Jun. 26, 2018

(54) AMPLIFIER

(71) Applicant: Onkyo Corporation, Osaka (JP)

(72) Inventors: Koji Takahama, Osaka (JP); Tsukasa Kato, Osaka (JP)

(73) Assignee: Onkyo Corporation, Osaka (JP)

( * ) Notice: Subject to any disclaimer, the term of this patent is extended or adjusted under 35 U.S.C. 154(b) by 0 days. days.

(21) Appl. No.: 15/673,991

(22) Filed: Aug. 10, 2017

(65) Prior Publication Data

US 2018/0062584 A1    Mar. 1, 2018

(30) Foreign Application Priority Data

Aug. 25, 2016 (JP) .................. 2016-164435

(51) Int. Cl.
| | |
|---|---|
| H04R 29/00 | (2006.01) |
| H04R 3/00 | (2006.01) |
| H03F 99/00 | (2009.01) |
| H03F 1/30 | (2006.01) |
| H03F 1/52 | (2006.01) |
| H03F 3/181 | (2006.01) |
| H03F 3/217 | (2006.01) |

(52) U.S. Cl.
CPC .............. H03F 1/30 (2013.01); H03F 1/52 (2013.01); H03F 3/181 (2013.01); H03F 3/217 (2013.01); *H03F 2200/03* (2013.01); *H03F 2200/321* (2013.01); *H03F 2200/351* (2013.01); *H03F 2200/447* (2013.01); *H03F 2200/462* (2013.01)

(58) Field of Classification Search
CPC ........ H04R 29/00; H04R 29/001; H04R 3/00; H04R 3/02; H04R 3/007; H04R 27/00; H04R 2460/03; H03F 1/30; H03F 1/52; H03F 1/181; H03F 1/0211; H03F 2200/03; H03F 2200/351; H03F 2200/321; H03F 2200/447; H03F 2200/462; H03F 2200/465; H03F 2200/471; H03F 3/183; H03F 3/21; H03F 3/217

See application file for complete search history.

(56) References Cited

U.S. PATENT DOCUMENTS

| | | | |
|---|---|---|---|
| 4,935,642 A * | 6/1990 | Obelode | H02J 3/14 307/32 |
| 5,029,299 A | 7/1991 | Rodgers | |
| 2003/0118193 A1* | 6/2003 | Leske | H04R 29/003 381/59 |

(Continued)

FOREIGN PATENT DOCUMENTS

| | | |
|---|---|---|
| EP | 2357726 A1 | 8/2011 |
| EP | 2642769 A1 | 9/2013 |

(Continued)

*Primary Examiner* — Thang Tran
(74) *Attorney, Agent, or Firm* — Renner, Otto, Boisselle & Sklar, LLP (57) ABSTRACT

To prevent temperature rise of an amplifier. An AV amplifier 1 that amplifies an audio signal includes a PWM modulator 5 that controls dynamic range of the audio signal to not more than a setting value, and a microcomputer 2 sets the setting value based on consumption current. The microcomputer 2 sets the setting value to a predetermined value (−35 dB) in case that state that consumption current is not less than a predetermined threshold (4.9 A or 3.6 A) continues for a predetermined time (2 minutes or 7.5 minutes).

8 Claims, 7 Drawing Sheets

(56) References Cited

U.S. PATENT DOCUMENTS

| | | | |
|---|---|---|---|
| 2005/0047615 A1* | 3/2005 | Kawamura | H03G 3/007 381/120 |
| 2005/0179489 A1* | 8/2005 | Zepp | H03F 1/30 330/251 |
| 2009/0140745 A1 | 6/2009 | Williams et al. | |
| 2009/0220110 A1* | 9/2009 | Bazarjani | H03F 1/0211 381/120 |
| 2011/0194705 A1 | 8/2011 | Gautama | |
| 2012/0002819 A1 | 1/2012 | Thormundsson et al. | |
| 2013/0251164 A1 | 9/2013 | Gautama | |
| 2015/0189447 A1* | 7/2015 | Vinter | H04R 25/30 381/323 |
| 2016/0029918 A1 | 2/2016 | Baker et al. | |
| 2016/0197588 A1* | 7/2016 | Olson | H04R 29/001 381/120 |
| 2016/0360315 A1* | 12/2016 | Matsuyama | H04R 3/007 |

FOREIGN PATENT DOCUMENTS

| | | |
|---|---|---|
| JP | 2003-037452 A | 2/2003 |
| JP | 2005-018511 A | 1/2005 |
| JP | 2011-055032 A | 3/2011 |
| JP | 2011-217295 A | 10/2011 |
| JP | 2015-122674 | 7/2015 |
| JP | 2016-116168 A | 6/2016 |

* cited by examiner

| THRESHOLD | CONSUMPTION CURRENT [A] | INPUT VALUE [V] | SETTING VALUE [dB] |
|---|---|---|---|
| THRESHOLD 1 | 5.4 | 1.6 | −25 |
| THRESHOLD 2 | 2.9 | 0.9 | −32 |

Fig. 4

| DRC STEP | SETTING VALUE(dB) |
|---|---|
| DRC STEP 0 | −25.0 |
| DRC STEP 1 | −28.0 |
| DRC STEP 2 | −29.0 |
| DRC STEP 3 | −30.0 |
| DRC STEP 4 | −31.0 |
| DRC STEP 5 | −32.0 |
| DRC STEP 6 | −35.0 |

Fig. 7

AMPLIFIER

BACKGROUND OF THE INVENTION

1. Field of the Invention

The present invention relates to an amplifier that amplifies an audio signal.

2. Description of the Related Art

In audio equipment including an amplifier that amplifies an audio signal, upper limit of temperature rise is regulated by safety standard of each country. Further, in the amplifier, measure method of maximum output is regulated by organization of each country. For example, in IEC (International Electrotechnical Commission) standard, upper limit of temperature rise of a coil is 150° C. In FTC (Federal Trade Commission) standard, in case of 2 channels output, after 2 channels drive is aged for 1 hour by ⅛ of rated value, 2 channels are output for 5 minutes continuously by rated value, and output is measured immediately. During measuring, temperature of each part of the amplifier keeps increasing. In case of FTC standard, measuring is finished after 5 minutes, output is decreased, and temperature rise stops.

An applicant files patent application with regard to an invention that performs switching of supply voltage and volume adjustment to prevent temperature rise of an amplifier in Japan (see JP 2015-122674 A.).

In safety standard limit value in IEC standard, drive of the amplifier must be performed with maximum signal level that can drive continuously. For this reason, there is a problem that temperature keeps rising and temperature reaches safety standard limit value when continuous drive is performed with maximum output.

SUMMARY OF THE INVENTION

An objective of the present invention is to prevent temperature rise of an amplifier.

An amplifier of the present invention that amplifies an audio signal comprising: a signal processor that controls dynamic range of the audio signal to not more than a setting value; and a controller that sets the setting value based on consumption current.

In the present invention, a controller sets setting value of dynamic range control by a signal processor based on consumption current. Thus, temperature rise can be prevented because dynamic range of an audio signal (output) is suppressed based on the consumption current.

Further, the audio signal does not clip and sound quality can be maintained because temperature rise is prevented by the dynamic range control. Herein, in case that output is decreased by volume control, all of volume sense is decreased because large sound and small sound are decreased. In case that output is decreased by the dynamic range control, all of volume sense is not decreased because large sound that exceeds the setting value is decreased and small sound that does not the setting value is not decreased. Further, a user can hear small sound because small sound such as speech is not decreased.

Preferably, wherein the controller sets the setting value to a predetermined value in case that the consumption current is not less than a predetermined threshold.

In the present invention, the controller sets the setting value to a predetermined value in case that the consumption current is not less than a predetermined threshold. Thus, temperature rise can be prevented because dynamic range of the audio signal is suppressed to not more than the predetermined value.

Preferably, wherein the controller sets the setting value to the predetermined value in case that state that the current consumption is not less than the predetermined threshold continues for a predetermined time.

When state that current consumption is not less than a predetermined threshold continues for a predetermined time, temperature of parts (for example, a coil) composing the amplifier rises to safety standard limit. Therefore, in the present invention, the controller sets the setting value to the predetermined value to prevent temperature rise in case that state that the current consumption is not less than the predetermined threshold continues for a predetermined time.

Preferably, further comprising: a detection circuit that is for detecting the consumption current, wherein the detection circuit converts the consumption current into voltage based on the current consumption, and the controller sets the setting value based on voltage that is converted by the detection circuit.

Preferably, further comprising: a switching power supply that supplies power supply voltage to each section.

In the present invention, the amplifier further comprises a switching power supply that supplies power supply voltage to each section. Herein, the switching power supply comprises a over current protect circuit. In the amplifier, there is a problem that power is down when consumption current exceeds capacity of the switching power supply. In the present invention, that power is down is prevented because dynamic range (output) of the audio signal is suppressed based on the consumption current. Further, in the switching power supply, a common mode filter is used for the measure against noise and there is a case where over heat protect such as temperature fuse is not provided. In this case, in the present invention, temperature rise can be prevented.

Preferably, wherein the controller changes the setting value with 1 dB based on the consumption current.

In the present invention, the controller changes the setting value with 1 dB based on the consumption current. Thus, dynamic range of the audio signal does not change rapidly.

Preferably, further comprising: a detection circuit that is for detecting the current consumption, wherein the signal processor is a PWM modulator, and the controller stops output of the PWM modulator in case that it detects that the detection circuit is abnormal.

In the present invention, the controller stops output of a PWM modulator so as to perform fail safe for safe in case that a detection circuit fails incase that it detects that the detection circuit is abnormal. Herein, abnormal of the detection circuit is a case where detection current value is not more than current value of the PWM modulator at timing of no signal and output voltage value of an operational amplifier that is included in the detection circuit indicates not more than lowest output voltage.

According to the present invention, temperature rise of an amplifier can be prevented.

DETAILED DESCRIPTION OF THE PREFERRED EMBODIMENTS

Figure 1:
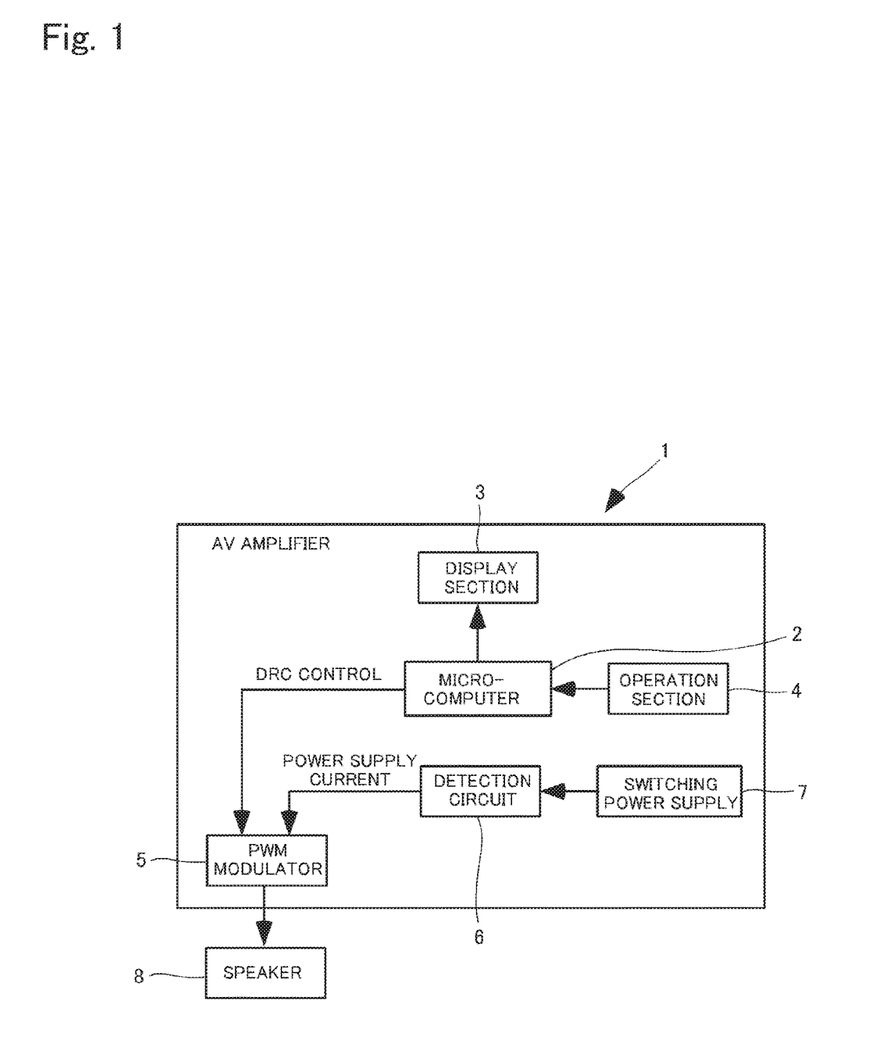
FIG. 1 is a block diagram illustrating a constitution of an AV amplifier according to an embodiment of the present invention.

An embodiment of the present invention is described below. FIG. 1 is a diagram illustrating an AV amplifier according to an embodiment of the present invention. The AV amplifier 1 (amplifier) amplifiers an audio signal that is input so as to output an amplified audio signal to a speaker 8. The AV amplifier 1 can amplify a 6 channels audio signal. As illustrated in FIG. 1, the AV amplifier 1 includes a microcomputer 2, a display section 3, an operation section 4, a PWM modulator 5, a detection circuit 6, and a switching power supply 7.

The microcomputer 2 (controller) is composed of hardware such as a CPU (Central Processing Unit), a ROM (Read Only Memory), a RAM (Random Access Memory), and an input and output terminal. The CPU controls respective sections composing the AV amplifier 1 according to a program that is stored in the ROM. Namely, the microcomputer 2 controls respective sections composing the AV amplifier 1. The RAM functions as a main memory.

The display section 3 displays setting screen, volume level and so on. The display section 3 is composed of an LCD (liquid crystal display), a vacuum fluorescent display and so on. The operation section 4 is for receiving user operation. The operation section 4 is composed of operation buttons that are provided at an enclosure of the AV amplifier 1 and a remote controller.

The PWM modulator (signal processor) 8 performs PWM modulation to an audio signal. The audio signal to which the PWM modulation is performed is output to the speaker 8. Herein, the PWM modulator 5 has signal processing function such as dynamic range control (hereinafter referred as to "DRC").

Figure 2:
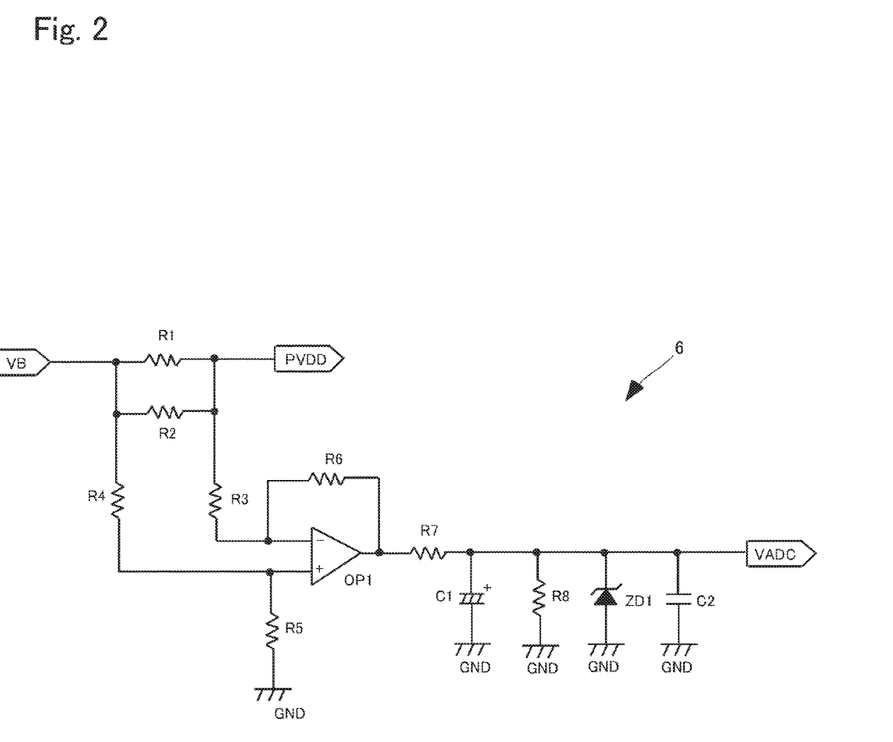
FIG. 2 is a diagram illustrating a circuit constitution of a detection circuit.

The detection circuit 6 is a circuit for detecting consumption current of the AV amplifier 1. The detection circuit 6 coverts consumption current into voltage based on consumption current. FIG. 2 is a diagram illustrating a circuit constitution of the detection circuit 6. The detection circuit 6 has resistors R1 to R8, condensers C1 and C2, a zener diode ZD1, an operational amplifier OP1. Each of resistors R1 and R2 is a detection resistor. One end of the resistor R1 is connected to a PVDD terminal. The other end of the resistor R1 is a VB terminal. Consumption current is input to the PVDD terminal. Power supply voltage is input to the VB terminal. The resistor R2 is connected against the resistor R1 in parallel. One end of the resistor 3 is connected to one end of the resistor R2. The other end of the resistor R3 is connected to an inverted input terminal of the operational amplifier OP1. One end of the resistor R4 is connected to the other end of the resistor R2. The other end of the resistor R4 is connected to a non-inverted terminal of the operational amplifier OP1.

One end of the resistor R5 is connected between the other end of the resistor R4 and the non-inverted input terminal of the operational amplifier OP1. The other end of the resistor R5 is connected to ground GND. The resistor R6 is a feedback resistor. The resistor R6 is connected to the non-inverted input terminal of the operational amplifier OP1 and an output terminal of the operational amplifier OP1. One end of the resistor R7 is connected to the output terminal of the operational amplifier OP1. The other end of the resistor R7 is connected to a VADC terminal. The VADC terminal is connected to the A/D port of the microcomputer 2. One end of the resistor R8 is connected between the other end of the resistor R7 and the VADC terminal. The other end of the resistor R8 is connected to ground GND.

The operational amplifier OP1 converts current into voltage. One end of the condenser C1 is connected between the other end of the resistor R7 and the VADC terminal. The other end of the condenser C1 is connected to ground GND. One end of the condenser C2 is connected between the other end of the resistor R7 and the VADC terminal. The other end of the condenser C2 is connected to ground GND. The zener diode ZD1 limits output voltage of the operational amplifier OP1. Destruction of the A/D port of the microcomputer 2 is prevented because output voltage of the operational amplifier OP1 is limited by the zener diode ZD1. A cathode of the Zener diode ZD1 is connected between the other end of the resistor R7 and the VADC terminal. An anode of the Zener diode ZD1 is connected to ground GND. Voltage based on current consumption is input to the A/D port of the microcomputer 2 because the VADC terminal is connected to the A/D port of the microcomputer 2 as described above.

The switching power supply 7 supplies power supply voltage to respective sections composing the AV amplifier 1. The switching power supply 7 has a primary side rectification circuit, a primary smooth circuit, a switching element, a control circuit that controls the switching element, a transformer, a secondary side rectification circuit, and a secondary side smooth circuit.

Figure 3:
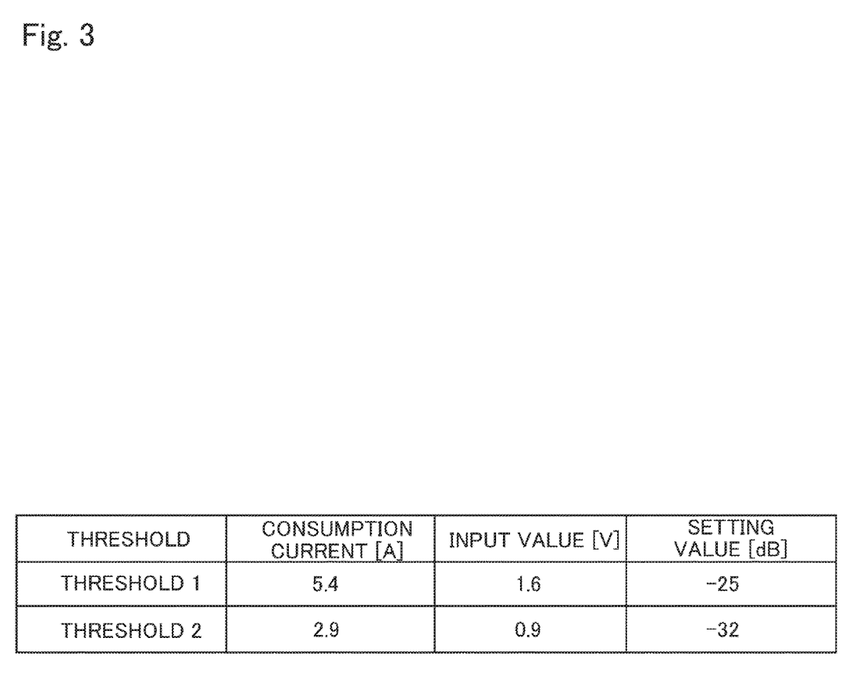
FIG. 3 is a diagram illustrating relationship between consumption current, input value that is input to an A/D port of a microcomputer, and setting value.

FIG. 3 is a diagram illustrating relationship between consumption current, input value that is input to the A/D port of the microcomputer 2, and setting value (described later). As illustrated in FIG. 2, in case that current consumption is 5.4 A, voltage of 1.6 V is input to the A/D port. Further, in case that current consumption is 2.9 A, voltage of 0.9 V is input to the A/D port.

As described above, the PWM modulator 5 has DRC function. DRC function is function to control dynamic range of the audio signal to not more than setting value. The microcomputer 2 sets setting value of DRC function by the PWM modulator 5 based on current consumption, namely, based on voltage that is input to the A/D port. As illustrated in FIG. 3, in case that current consumption is not less than 5.4 A, the microcomputer 2 sets setting value of DRC function to −25 dB. Further, in case that current consumption is not more than 2.9 A, the microcomputer 2 sets setting value of DRC function to −32 dB. The microcomputer 2 sets setting value of DRC function by setting value to a register of the PWM modulator 5.

Figure 4:
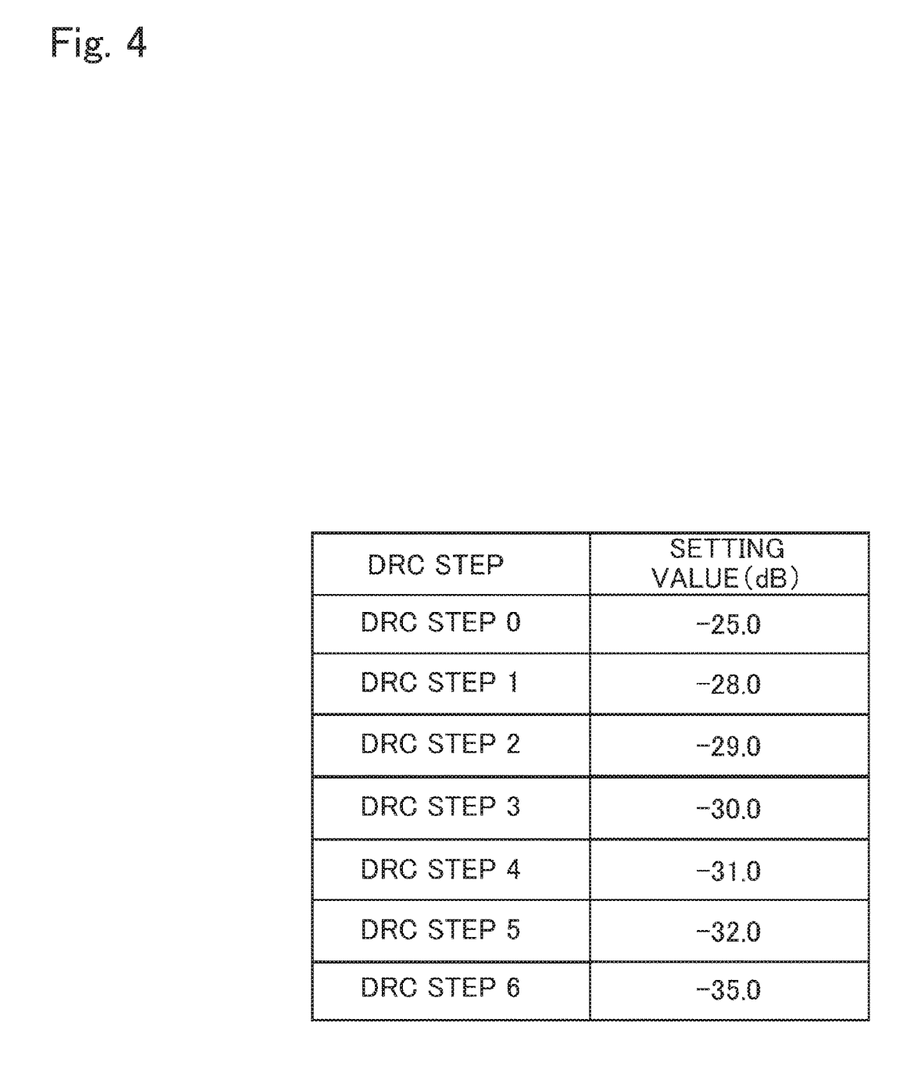
FIG. 4 is a diagram illustrating relationship between step of DRC function and setting value.

FIG. 4 is a diagram illustrating relationship between step of DRC function and setting value. As illustrated in FIG. 4, step 0 corresponds to setting value −25.0 dB. Step 6 corresponds to setting value −35.0 dB. The microcomputer 2 increases and decreases step (setting value) with 1 step based on current consumption basically. Herein, in case that the microcomputer 2 transfers from step 0 to step 1 and from step 1 to step 0, it increases and decreases setting value with 3 dB (±3 dB). Further, the microcomputer 2 increases and decreases setting value with 1 dB (±1 dB) between step 1 and step 5. Further, in case that the microcomputer 2 transfers from step 5 to step 6 and from step 6 to step 5, it increases and decreases setting value with 3 dB (±3 dB).

Figure 5:
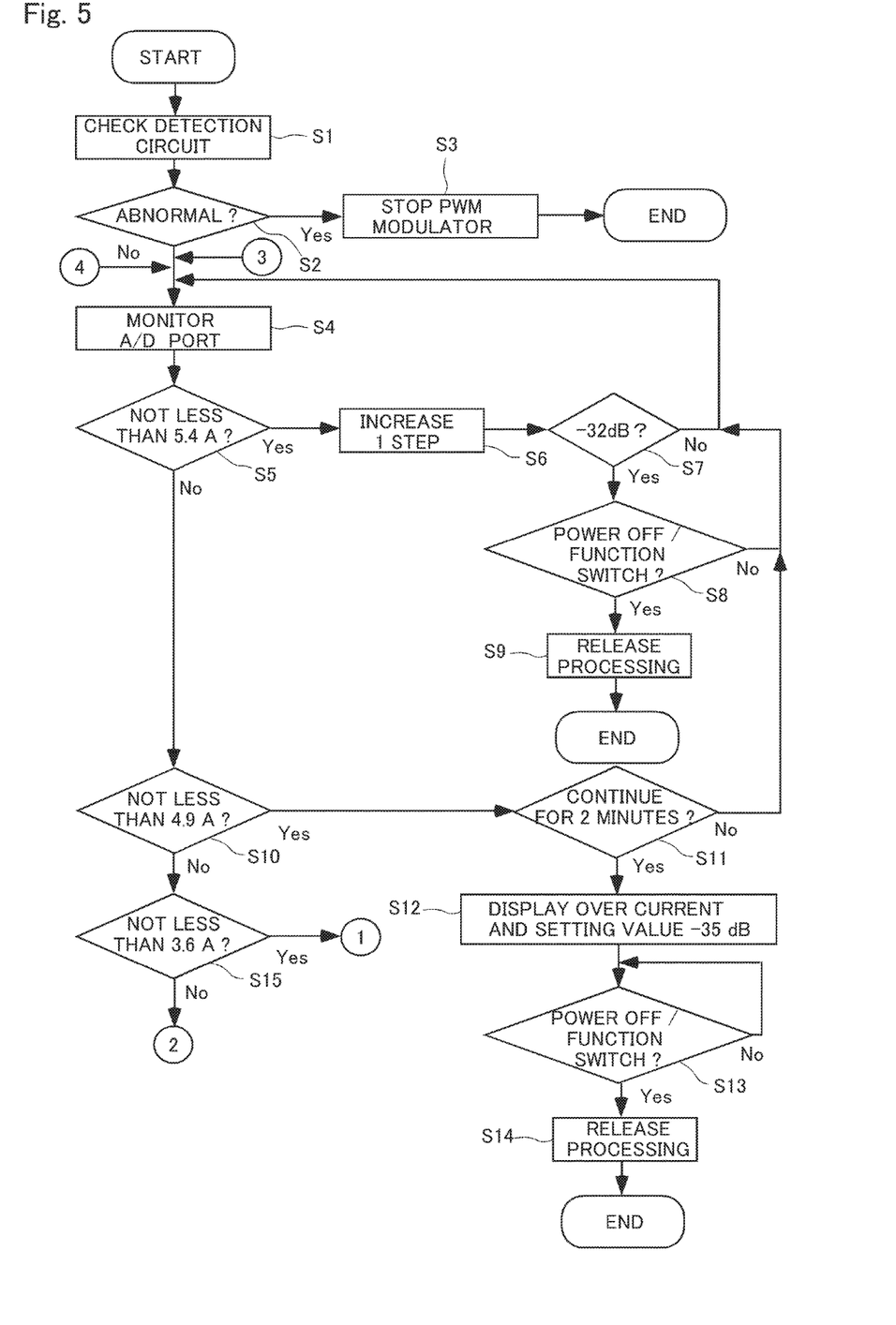
FIG. 5 is a flowchart illustrating processing to prevent temperature rise.
Figure 6:
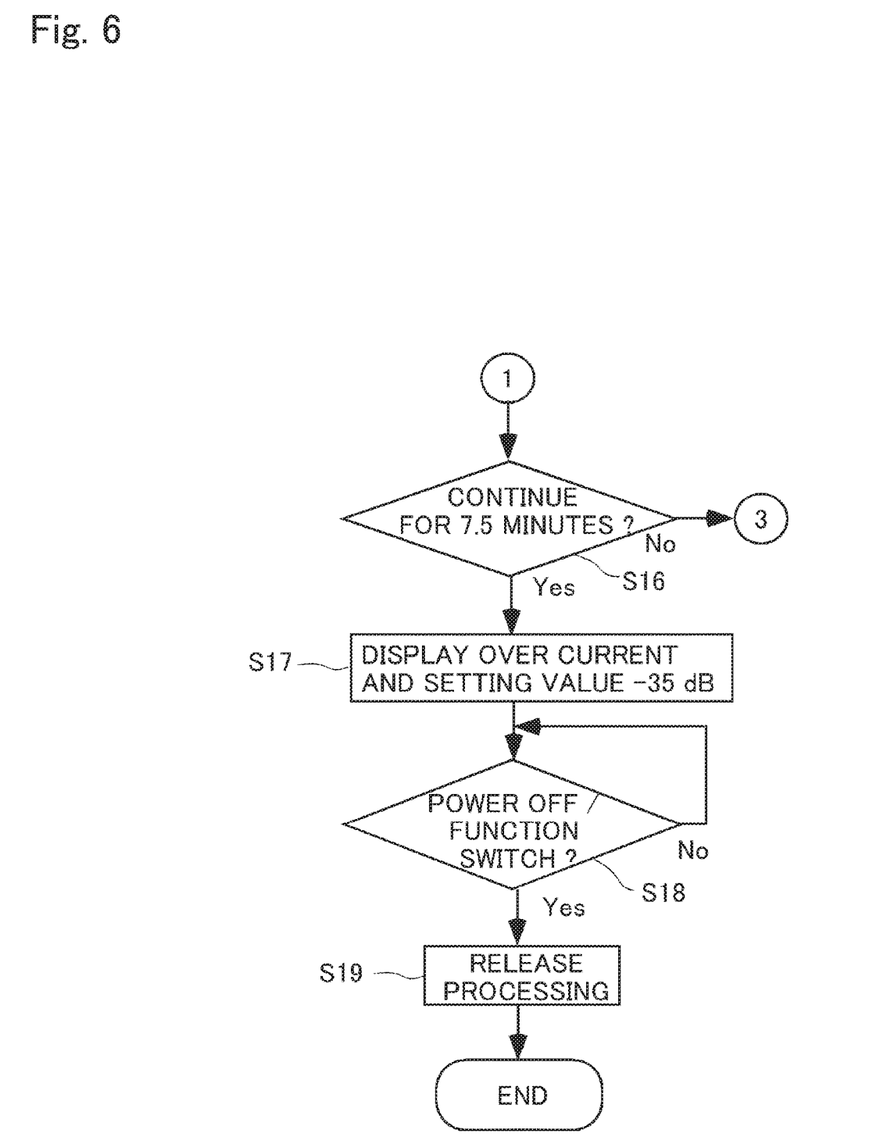
FIG. 6 is a flowchart illustrating processing to prevent temperature rise.
Figure 7:
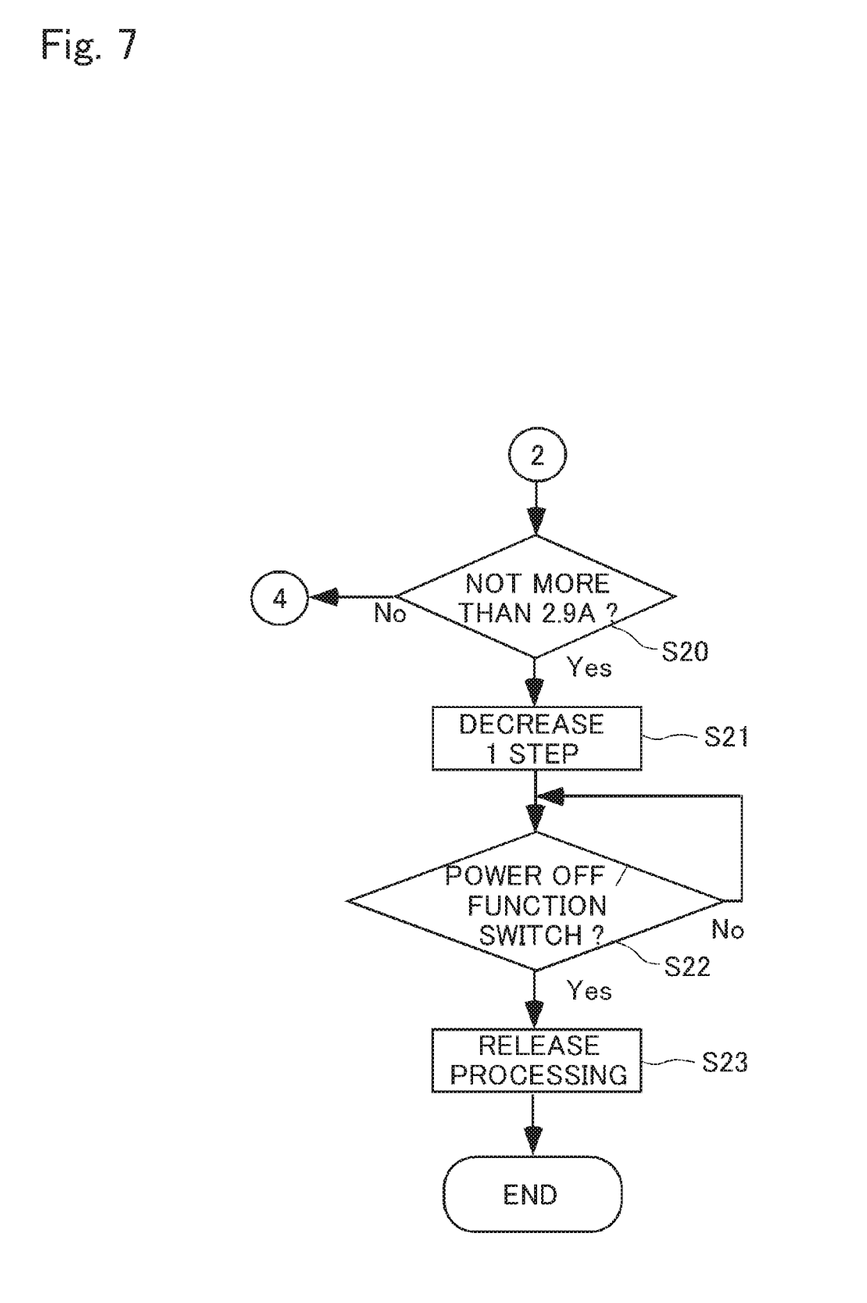
FIG. 7 is a flowchart illustrating processing to prevent temperature rise.

Processing to prevent temperature rise is described based on flowcharts illustrated in FIG. 5 to FIG. 7 below. The microcomputer 2 checks the detection circuit 6 (S1). Next, the microcomputer 2 judges whether the detection circuit 6 is abnormal or not (S2). Herein, abnormal of the detection circuit 6 is case where detection current value is not more than current value at timing of no signal of the PWM modulator 5 or output voltage value of the operational amplifier OP1 included in the detection circuit 6 indicates not more than lowest output voltage. When the microcomputer 2 judges that the detection circuit 6 is abnormal (S2: Yes), it stops output of the PWM modulator 5 (S3).

In case that the microcomputer 2 judges that the detection circuit 6 is not abnormal (S2: No), it monitors the A/D port (S4). Next, the microcomputer 2 judges whether consumption current is not less than 5.4 A or not (S5). Herein, 5.4 A of consumption current corresponds to 140 W of sum output. In case that the microcomputer 2 judges that consumption current is not less than 5.4 A (S5: Yes), it increases step of DRC function with 1 step (S6).

Next, the microcomputer 2 judges whether setting value becomes −32 dB or not (S7). In case that the microcomputer 2 judges that setting value does not become −32 dB (S7: No), it performs processing of S4. In case that the microcomputer 2 judges that setting value becomes −32 dB (S7: Yes), it judges whether power becomes OFF or not, or whether function is switched or not (S8). In case that the microcomputer 2 judges that power does not become OFF and function is not switched (S8: No), it performs processing of S4.

Incase that the microcomputer 2 judges that power becomes OFF or function is switched (S8: Yes), it releases processing to prevent temperature rise and returns setting value of DRC function to default (S9).

In case that the microcomputer 2 judges that current consumption is not equal to or more than 5.4 A, that is, less than 5.4 A (S5: No), it judges whether current consumption is not less than 4.9 A (threshold) or not (S10). Herein, 4.9 A of current consumption corresponds to 120 W of sum output. Further, 4.9 A of current consumption corresponds to 1.4 V of voltage that is input to the A/D port of the microcomputer 2. In case that the microcomputer 2 judges that current consumption is not less than 4.9 A (S10: Yes), it judges whether state that current consumption is not less than 4.9 A continues for two minutes (predetermined time) or not (S11). In case that the microcomputer 2 judges that state that current consumption is not less than 4.9 A does not continue for two minutes (S11: No), it performs processing of S4.

In case that the microcomputer 2 judges that state that current consumption is not less than 4.9 A continues for two minutes (S11: Yes), it displays over current on the display section 3 and sets setting value to −35 dB (predetermined value) (S12). Herein, when state that current consumption is not less than 4.9 A continues for two minutes, temperature of a coil rises to safety standard limit. Therefore, setting value is set to −35 dB to prevent temperature rise. Next, the microcomputer 2 judges whether power becomes OFF or not, or whether function is switched or not (S13). Until the microcomputer 2 judges that power does not become OFF or function is not switched (S13: No), it performs processing of S13 repeatedly. In case that the microcomputer 2 judges that power becomes OFF or function is switched (S13: Yes), it releases processing to prevent temperature rise and returns to setting value of the DRC function to default (S14).

In case that the microcomputer 2 judges that current consumption is not equal to or more than 4.9 A, that is, less than 4.9 A (S10: No), it judges whether current consumption is not less than 3.6 A (threshold) or not (S15). Herein, 3.6 A of current consumption corresponds to 90 W of sum output. Further, 3.6 A of current consumption corresponds to 1.0 V of voltage that is input to the A/D port of the microcomputer 2. In case that the microcomputer 2 judges that current consumption is not less than 3.6 A (S15: Yes), it judges whether state that current consumption is not less than 3.6 A continues for 7.5 minutes (predetermined time) or not (S16). In case that the microcomputer 2 judges that state that current consumption is not less than 3.6 A does not continue for 7.5 minutes (S16: No), it performs processing of S4.

In case that the microcomputer 2 judges that state that current consumption is not less than 3.6 A continues for 7.5 minutes (S16: Yes) and displays over current on the display section 3 and sets setting value to −35 dB (predetermined value) (S17). Herein, when state that current consumption is not less than 3.6 A continues for 7.5 minutes, temperature of a coil rises to 150° C. (safety standard limit). Therefore, setting value is set to −35 dB to prevent temperature rise. Next, the microcomputer 2 judges whether power becomes OFF or not, or function is switched or not (S18). Until the microcomputer 2 judges that power does not become OFF or function is not switched (S18: No), it performs processing of S18 repeatedly. In case that the microcomputer 2 judges that power becomes OFF or function is switched (S18: Yes), it releases processing to prevent temperature rise and returns setting value of DRC function of default (S19).

In case that the microcomputer 2 judges that current consumption is not equal to or more than 3.6 A, that is, less than 3.6 A (S15: No), it judges whether current consumption is not equal to or less than 2.9 A, that is, not more than 2.9 A or not (S20). Herein, 2.9 A of current consumption corresponds to 70 W of sum output. In case that the microcomputer 2 judges that current consumption is more than 2.9 A (S20: No), it performs processing of S1. In case that the microcomputer 2 judges that current consumption is not less than 2.9 A (S20: Yes), it decreases step of DRC function with 1 step (S21).

Next, the microcomputer 2 judges whether power becomes OFF or not, or function is switched or not (S22). Until the microcomputer 2 judges that power does not become OFF or function is not switched (S22: No), it performs processing of S22 repeatedly. In case that the microcomputer 2 judges that power becomes OFF or function is switched (S22: Yes), it releases processing to prevent temperature rise and returns setting value of DRC function to default (S23).

As described above, in the present embodiment, the microcomputer 2 sets setting value of the DRC function by the PWM modulator 5 based on the consumption current. Thus, temperature rise can be prevented because dynamic range (output) of the audio signal (output) is suppressed based on the consumption current.

Further, the audio signal does not clip and the sound quality can be maintained because temperature rise is prevented by the DRC function. Herein, in case that output is decreased by volume control, all of volume sense is decreased because large sound and small sound are decreased. In case that output is decreased by the DRC function, all of volume sense is not decreased because large sound that exceeds the setting value is decreased and small sound that does not the setting value is not decreased. Further, the user can hear small sound because small sound such as speech is not decreased.

Further, in the present embodiment, the microcomputer 2 sets the setting value to −35 dB (predetermined value) in case that the consumption current is not less than 4.9 A (predetermined threshold) or 3.6 A (predetermined threshold). Thus, temperature rise can be prevented because dynamic range of the audio signal is suppressed to not more than −35 dB.

When state that current consumption is not less than 4.9 A continues for 2 minutes (predetermined time), temperature of the coil rises to safety standard limit. Therefore, the microcomputer 2 sets the setting value to −35 dB to prevent temperature rise.

When state that current consumption is not less than 3.6 A continues for 7.5 minutes (predetermined time), temperature of the coil rises to safety standard limit, for example. Therefore, in the present embodiment, the microcomputer 2 sets the setting value to −35 dB to prevent temperature rise in case that state that the current consumption is not less than 3.6 A continues for 7.5 minutes.

Further, in the present embodiment, the AV amplifier 1 further includes the switching power supply 7 that supplies power supply voltage to each section. Herein, the switching power supply 7 includes a over current protect circuit. In the AV amplifier 1, there is a problem that power is down when consumption current exceeds capacity of the switching power supply 7. In the present embodiment, that power is down is prevented because dynamic range (output) of the audio signal is suppressed based on the consumption current. Further, in the switching power supply 7, a common mode filter is used for a measure against noise and there is a case where overheat protection such as temperature fuse is not provided. In this case, in the present embodiment, temperature rise can be prevented.

Further, in the present embodiment, the microcomputer 2 changes the setting value with 1 dB based on the consumption current basically. Thus, dynamic range of the audio signal does not change rapidly.

Further, in the present embodiment, the microcomputer 2 stops output of the PWM modulator 5 so as to perform fail safe for safe in case where the detection circuit 6 fails incase that it detects that the detection circuit 6 is abnormal.

The embodiment of the present invention is described above, but the mode to which the present invention is applicable is not limited to the above embodiment and can be suitably varied without departing from the scope of the present invention.

Numerical Value such as continuous time of the consumption current (in the above mentioned embodiment, 2 minutes and 7.5 minutes) and setting value of the DRC function in the above mentioned embodiment can be appropriately changed based on temperature rise and the consumption current. Further, number of channels of the audio signal that AV amplifier 1 can amplify are not limited to 6 channels. The setting value of the DRC function changes as the number of channels is changed.

In the present embodiment, the PWM modulator 5 has the DRC function and the PWM modulator 5 controls dynamic range of the audio signal. Not limited to this, a DSP (Digital Signal Processor) that has the DRC function or the like may control dynamic range of the audio signal.

The present invention can be suitably employed in an amplifier that amplifies an audio signal.

What is claimed is:

1. An amplifier that amplifies an audio signal comprising:
a signal processor that controls dynamic range of the audio signal to not more than a setting value; and
a controller that sets the setting value based on a consumption current of the amplifier.

2. The amplifier according to claim 1,
comprising a detection circuit that is for detecting the consumption current,
wherein the controller sets the setting value to a predetermined value in case that the consumption current is not less than a predetermined threshold.

3. The amplifier according to claim 2,
wherein the controller sets the setting value to the predetermined value in case that state that the current consumption is not less than the predetermined threshold continues for a predetermined time.

4. The amplifier according to claim 1 further comprising:
a detection circuit that is for detecting the consumption current,
wherein the detection circuit converts the consumption current into voltage based on the current consumption, and
the controller sets the setting value based on voltage that is converted by the detection circuit.

5. The amplifier according to claim 1 further comprising:
a switching power supply that supplies power supply voltage to the signal processor and the controller.

6. The amplifier according to claim 1,
wherein the controller changes the setting value with 1 dB based on the consumption current.

7. The amplifier according to claim 1 further comprising:
a detection circuit that is for detecting the current consumption,
wherein the signal processor is a PWM modulator, and
the controller stops output of the PWM modulator in case that it detects that the detection circuit is abnormal.

8. An amplifier that amplifies an audio signal comprising:
circuitry configured to:
control dynamic range of the audio signal to not more than a setting value; and
set the setting value based on a consumption current of the amplifier.

* * * * *